Figure 1:
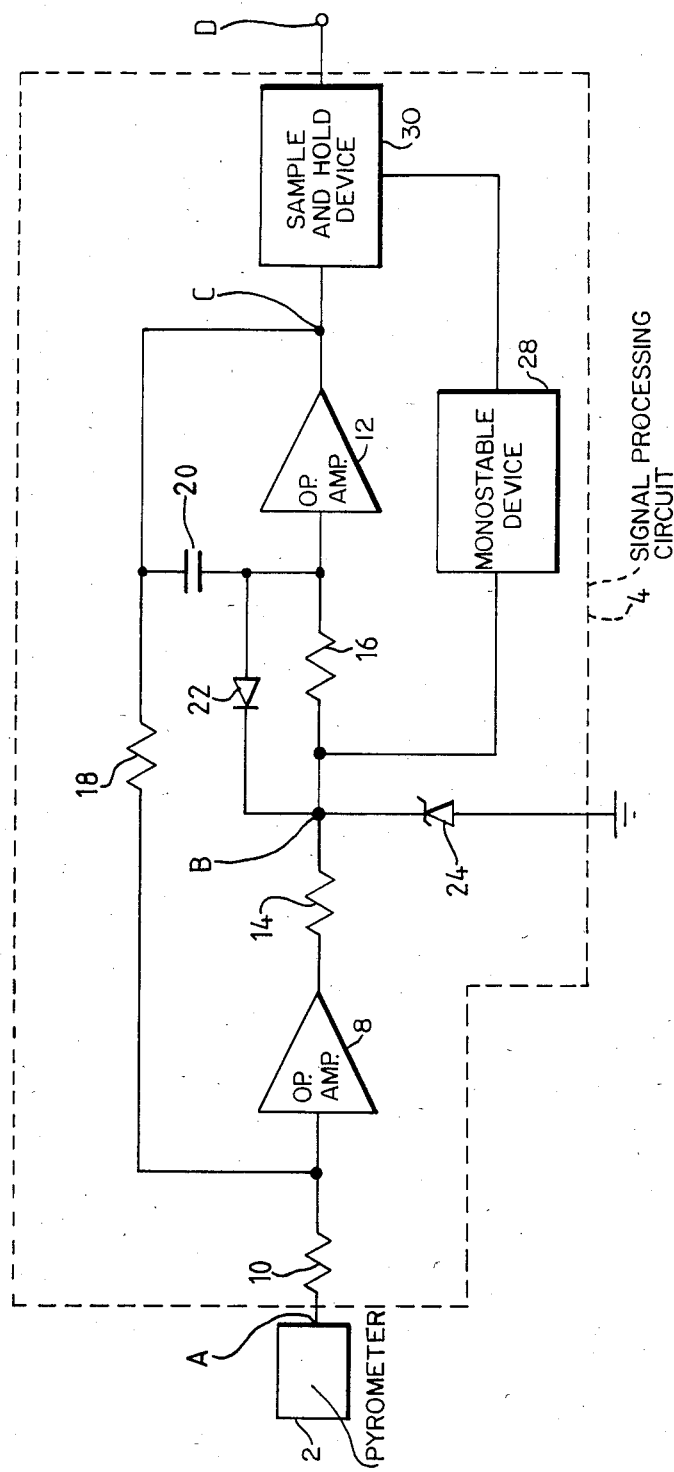

United States Patent [19]

Seymour

[11] Patent Number: 4,588,954
[45] Date of Patent: May 13, 1986

[54] APPARATUS FOR PROCESSING OF PYROMETER SIGNALS

[75] Inventor: Stephen R. Seymour, Bristol, England

[73] Assignee: Rolls-Royce Limited, London, England

[21] Appl. No.: 480,376

[22] Filed: Mar. 30, 1983

[30] Foreign Application Priority Data

Apr. 13, 1982 [GB] United Kingdom ............... 8210702

[51] Int. Cl.[4] .................. H03K 5/08; H03K 5/153
[52] U.S. Cl. .................. 328/151; 60/39.281;
307/353; 307/520; 328/165; 374/144
[58] Field of Search .............. 307/352, 353, 356, 358,
307/359, 542, 543, 546, 555, 556, 562, 517, 520;
328/132, 151, 6, 165; 374/144; 415/118;
60/39.281

[56] References Cited

U.S. PATENT DOCUMENTS 3,667,056  5/1972  Allington et al. ............... 328/151
3,696,678  10/1972  Mossey .
4,241,300  12/1980  Hayes et al. .................. 318/590
4,311,963  1/1982  Watanabe et al. ............... 328/163

OTHER PUBLICATIONS

Fritz Lieneweg, Handbuch der Technischen Temperaturmessung, 1976, p. 170.

Primary Examiner—John Zazworsky
Attorney, Agent, or Firm—Parkhurst & Oliff

[57] ABSTRACT

A circuit is provided for eliminating the effects of spurious signals from a pyrometer in a gas turbine engine. The pyrometer signal is fed to a part of the circuit (8,12,16,20,24) which produces an inverted and rate limited output signal c representative of the pyrometer output signal. Signal c is fed back to the input of amplifier 8 and is subtracted from it and amplifier 8 outputs a positive or negative signal depending on whether or not its input is positive or negative. The output is passed to a positive edge triggering device 28 which triggers a sample and hold device 30 the output of which constitutes the output of the circuit. When the pyrometer signal increases very rapidly due to a spurious signal, the input to the amplifier 8 rises more rapidly than the rate limited feedback from amplifier 12 so that the output goes positive to trigger device 28 and remains positive until the spurious signal has died away. The sample and hold device 30 thus holds the last sampled pyrometer signal and is not affected by the spurious signal.

3 Claims, 5 Drawing Figures

APPARATUS FOR PROCESSING OF PYROMETER SIGNALS

This invention relates to signal processing, and in particular to the processing of electrical signals from pyrometers.

In the use of pyrometers in gas turbine engines to measure turbine temperatures, the pyrometer output signal is frequently degraded due to the spurious effect of uncombusted carbon particles from the combustion chamber which pass the pyrometer sensor and give a falsely high reading, leading to unstable running of the engine.

It has been proposed to use two sensors responsive to different wavelengths of radiation in order to sense the passing of a carbon particle (which has a different wavelength emission distribution from the turbine) and to allow the output signal of the pyrometer to be adjusted accordingly. However, such a system is somewhat complicated, and therefore expensive, requiring in addition to two sensors a schedule in accordance with the emmission distributions of carbon particles at various temperatures as well as analogue-digital circuitry to implement the schedule.

It is an object of the present invention to provide a circuit suitable for processing the output signal from a pyrometer whereby the above disadvantages may be overcome or at least alleviated.

In accordance with a first aspect of the invention a circuit for processing a pyrometer output signal comprises:

sample and hold means for sampling the pyrometer output signal and for producing an output signal whose value is held equal to the last sampled value of the pyrometer output signal;

triggering means for triggering the sample and hold means to sample the pyrometer output signal; and rate responsive means for preventing the triggering means from triggering the sample and hold means to sample the pyrometer output signal in response to the rate of increase of the pyrometer output signal exceeding a predetermined rate.

In accordance with a second aspect of the invention a circuit for processing a pyrometer output signal comprises:

means for deriving from the pyrometer output signal a signal representative thereof;

sample and hold means for sampling the representative signal and for producing an output signal whose value is held equal to the last sampled value of the representative signal;

triggering means for triggering the sample and hold means to sample the representative signal; and rate responsive means for preventing the triggering means from triggering the sample and hold means to sample the representative signal in response to the rate of increase of the pyrometer output signal exceeding a predetermined rate.

One circuit for processing a pyrometer output signal in accordance with the invention will now be described, by way of example only, with reference to the accompanying drawings, in which:

FIG. 1 shows a block schematic diagram of the circuit; and

FIGS. 2(a)–(d) shows typical waveforms occuring at various points in the circuit.

Figure 2A:
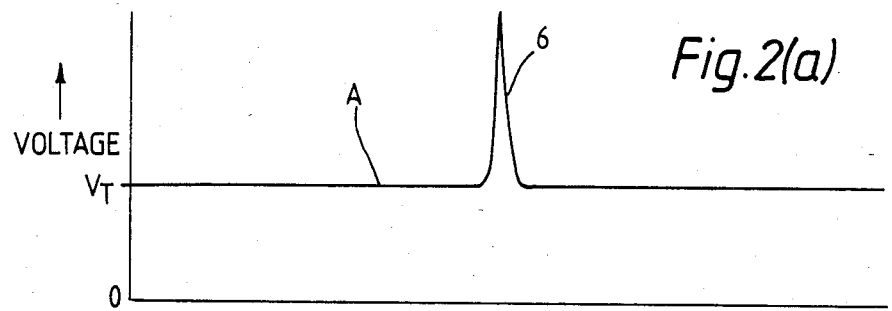

Referring firstly to FIG. 1 a pyrometer 2 is arranged in known manner to sense the temperature of the turbine (not shown) of a gas turbine engine (also not shown) in order to control the engine. The pyrometer 2 produces an electrical output signal (a typical sample of whose waveform is shown in FIG. 2(a)) which is applied to the input of a signal processing circuit 4. The pyrometer output signal comprises a voltage $V_T$ representative of the true temperature of the turbine, but typically there are superimposed on this true voltage a number of random spikes 6 due to spurious, hot, light-emitting particles of uncombusted carbon which emerge from the combustion chamber (not shown) of the engine. If this signal is used to control the engine, unstable running will result due to the false effect of the spikes 6. As will be explained below, the purpose of the signal processing circuit 4 is to reduce the effect of the spikes 6 in the pyrometer output signal and to allow the processed signal to be used to produce stable, controlled running of the engine.

The signal processing circuit 4 includes a first operational amplifier 8 whose input is connected to the input of the circuit via a current-limiting resistor 10. The output of the operational amplifier 8 is connected to the input of a second operational amplifier 12 via further current-limiting resistors 14,16. The output of the operational amplifier 12 is fed back to the input of the operational amplifier 8 via a current-limiting resistor 18. The output of operational amplifier 12 is also fed back to its own input via a capacitor 20 and to a point between the resistors 14 and 16 via a diode 22. A Zener diode 24 is connected between ground and the point between the resistors 14 and 16.

The point between the resistors 14 and 16 is connected to the triggering input of a positive-edge-triggered monostable device 28. The output of the operational amplifier 12 is connected to the sampling input of a sample and hold device 30. The triggering input of the sample and hold device 30 is connected to the output of the monostable device 28. The output of the sample and hold device is connected to the output of the circuit 4.

In operation of the circuit, the output of amplifier 12 is inverted with respect to the input to amplifier 8 and the operational amplifiers 8 and 12 act as a rate limiter, amplifier 8 effectively comparing the output of amplifier 12 with the pyrometer output signal.

Figure 2B:
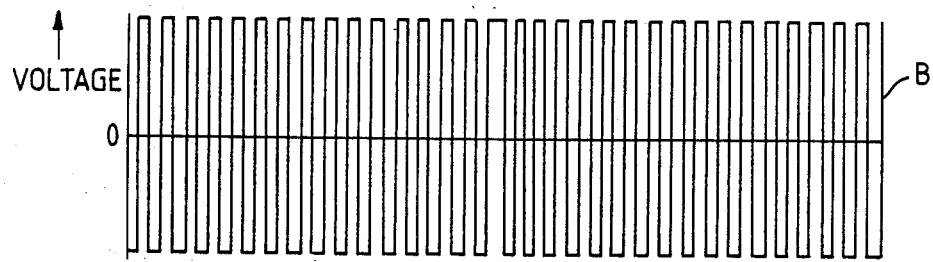
Figure 2C:
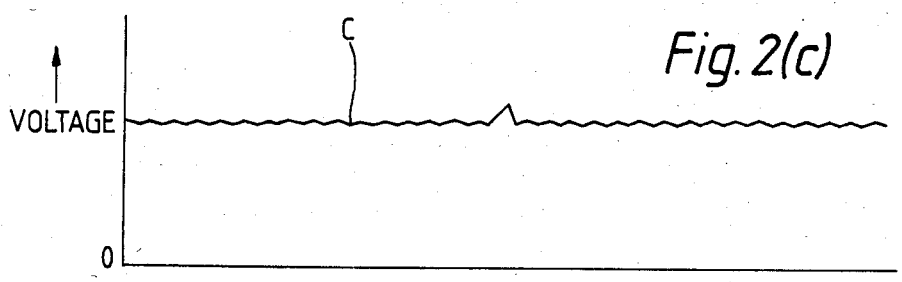
Figure 2D:
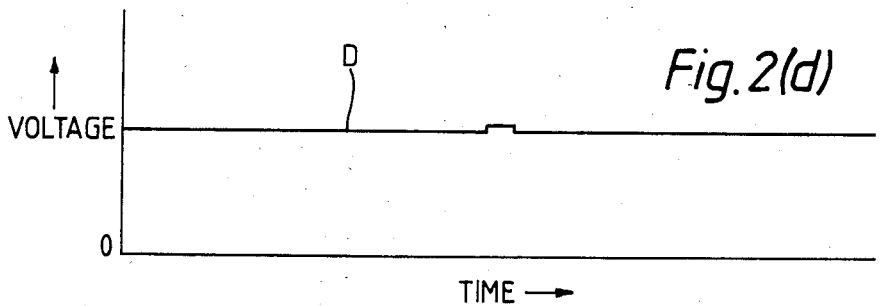

Referring now also to FIG. 2, at the instant the pyrometer output signal A, see FIG. 2(a), is larger than the output C, see FIG. 2(c), from amplifier 12, amplifier 8 switches to positive saturation (see waveform B, FIG. 2(b)). This causes the output of amplifier 12 to increase at a rate determined by the breakdown voltage V of the Zener diode 24 and the values C and R of capacitor 20 and the resistor 16 respectively; this rate (given by the expression V/CR) is selected to be just larger than the maximum rate of change of the pyrometer output signal A during normal engine conditions.

At the instant that the pyrometer output signal is smaller than the output of amplifier 12, amplifier 8 switches towards negative saturation and this causes the output of amplifier 12 to decrease at a rate determined by the values of the breakdown voltage V of the Zener diode 24 and the capacitance C of the capacitor 20. In practice this means that the decrease in the output of amplifier 12 closely follows the decrease in the pyrometer output signal.

If the pyrometer output signal is a steady state DC signal or a varying signal of a rate lower than the limiting rate of the rate limiter, the output of amplifier 8 will switch towards positive saturation and the output of amplifier 12 will increase at the rate V/CR until the output of amplifier 12 is fractionally larger than the pyrometer output signal. This will cause amplifier 8 to switch towards negative saturation and then the output of amplifier 12 will decrease very rapidly (at the rate determined by V and C) to a value fractionally below the pyrometer output signal, at which time the output of amplifier 8 will switch towards positive saturation. While this condition persists, this process will continue.

In practice the output of amplifier 12 is a rate limited representation of the pyrometer output signal which closely follows the pyrometer output signal (so long as the rate of increase of the pyrometer output signal does not exceed the limiting rate of the rate limiter), with a very small error as described above.

The rate limited representation of the pyrometer output signal, i.e. the output C of amplifier 12, is fed to the sampling input of the sample and hold device 30. The device 30 is normally in the "HOLD" mode and is triggered from "HOLD" to "SAMPLE" by the positive-edge-triggered monostable device 28 which is itself triggered by the output from amplifier 8. The output time constant of the monostable device 28 is set equal to the sum of the acquisition time (the time required for the output to settle to its final value) and the aperture time (the time required to switch from "SAMPLE" mode to "HOLD" mode) of the sample and hold device 30.

Thus the sample and hold device 30 is triggered from "HOLD" mode to "SAMPLE" mode every time the operational amplifier 8 switches to positive saturation and the device 30 holds the last sampled value of the rate-limited representation of the pyrometer output signal until the amplifier 8 next switches to positive saturation. In this way, the absence of a spike in the pyrometer output signal, the signal produced at the output of the sample and hold device 30 (see waveform D, FIG. 2(d)) closely follows the pyrometer output signal, re-sampling the output of amplifier 12 each time it falls below the pyrometer output signal as the output of amplifier 12 oscillates about the pyrometer output signal. Upon the occurrence of a spike, however, the output of the sample and hold device 30 is held at the first sampled value in the rising edge of the spike (which has a rate of increase greater than the limiting rate of the rate limiter) until the value of the spike falls to below the value to which the rate limited output of amplifier 12 has risen. This is because once the leading edge of the spike starts to increase at a rate greater than the limiting rate of the rate limiter the amplifier 8 remains in positive saturation and so the positive-edge-triggered monostable device 28 is prevented from triggering, so preventing the sample and hold device 30 from re-sampling, until the value of the pyrometer output signal falls to just below the value to which the output of amplifier 12 has by then risen. The amplifier 8 then switches into negative saturation and subsequently into positive saturation, as the rate limiter output again follows the pyrometer output, causing the monostable device 28 to trigger and so causing the sample and hold another spike occurs.

In this way the output D of the sample and hold device 30 closely follows the pyrometer output signal in the absence of a spike, and in the event of a spike holds the output at the last sampled value until the spike has passed, so reducing the effect of the spike and allowing the signal to be used to produce stable, controlled running of the engine.

The circuit of FIG. 1 has been tested with a rate limiter limiting rate (V/CR) of 120 V/S and a sample and hold device aperture time of 10 $\mu$m and has proved to be very accurate.

It will be appreciated that although in the above described circuit the signal sampled by the sample and hold device is a rate-limited representation of the pyrometer output signal, this is not necessary and instead some other signal (either a signal representative of the pyrometer output signal or the pyrometer output signal itself) may be fed to the sampling input of the sample and hold device if desired.

I claim:

1. A circuit for processing a pyrometer output signal, the circuit comprising:
   rate limiting means for receiving the pyrometer output signal and for deriving therefrom a rate-limited representation thereof and a signal representing a rate of increase thereof;
   sample and hold means for sampling said rate-limited representation and for producing an output signal whose value is held equal to the last sampled value of said rate-limited representation; and
   triggering means for receiving the signal representing the rate of increase of the pyrometer output signal as a control input and for repeatedly triggering the sample and hold means to sample said rate-limited representation when the rate of increase of the pyrometer output signal is below a predetermined rate, and for preventing said triggering when the rate of increase of the pyrometer output signal exceeds said predetermined rate.

2. A circuit according to claim 1 wherein the rate limiting means comprises a first amplifier for amplifying the pyrometer output signal, a second amplifier for amplifying the output of the first amplifier, feedback means from the output of the second amplifier to the input of the first amplifier and to the input of the second amplifier, and voltage breakdown means connected from a point in the signal path between the output of the first amplifier and the input of the second amplifier to ground, whereby the input to the first amplifier is the algebraic sum of the pyrometer output signal and the output from the second amplifier, and the output of the first amplifier changes between a positive and a negative value depending on the positive or negative value of its input respectively, and the output of the second amplifier oscillates about the pyrometer output signal at a predetermined rate of change.

3. A circuit according to claim 2 wherein the triggering means comprises a monostable device whose triggering input is connected to the output of the first amplifier and whose output is connected to trigger the sample and hold means.

* * * * *